(12) United States Patent
Koizumi et al.

(10) Patent No.: US 7,330,037 B2
(45) Date of Patent: Feb. 12, 2008

(54) ELECTRICAL CHARACTERISTIC MEASURING PROBE AND METHOD OF MANUFACTURING THE SAME

(75) Inventors: Naoyuki Koizumi, Nagano (JP); Akinori Shiraishi, Nagano (JP); Kei Murayama, Nagano (JP)

(73) Assignee: Shinko Electric Industries Co., Ltd, Nagano-Shi (JP)

( * ) Notice: Subject to any disclaimer, the term of this patent is extended or adjusted under 35 U.S.C. 154(b) by 0 days.

(21) Appl. No.: 10/980,162

(22) Filed: Nov. 4, 2004

(65) Prior Publication Data
US 2005/0110507 A1   May 26, 2005

(30) Foreign Application Priority Data
Nov. 26, 2003   (JP) .............................. 2003-395830

(51) Int. Cl.
*G01R 31/02* (2006.01)
*G01R 1/06* (2006.01)

(52) U.S. Cl. ..................... 324/754; 324/158.1; 439/70
(58) Field of Classification Search ........ 324/754–765, 324/158.1; 29/842, 852, 846
See application file for complete search history.

(56) References Cited

U.S. PATENT DOCUMENTS

| | | | | |
|---|---|---|---|---|
| 4,382,228 | A | | 5/1983 | Evans .......................... 324/158 |
| 4,961,052 | A | | 10/1990 | Tada et al. ................... 324/158 |
| 5,198,755 | A | * | 3/1993 | Ikeda et al. ................. 324/754 |
| 5,491,891 | A | * | 2/1996 | Isaac ........................... 29/842 |
| 5,545,045 | A | | 8/1996 | Wakamatsu et al. .......... 439/70 |
| 5,723,347 | A | * | 3/1998 | Hirano et al. ................ 29/25.1 |
| 5,989,994 | A | | 11/1999 | Khoury et al. ............... 438/615 |
| 6,114,864 | A | * | 9/2000 | Soejima et al. .............. 324/754 |
| 6,174,744 | B1 | * | 1/2001 | Watanabe et al. ............. 438/14 |
| 6,486,688 | B2 | * | 11/2002 | Taura et al. ................. 324/757 |
| 6,791,176 | B2 | * | 9/2004 | Mathieu et al. .............. 257/690 |
| 2002/0033707 | A1 | | 3/2002 | Kohno et al. ................ 324/754 |
| 2002/0048973 | A1 | | 4/2002 | Zhou et al. .................... 439/66 |
| 2002/0072136 | A1 | | 6/2002 | Kanamaru et al. ............ 438/17 |
| 2003/0052703 | A1 | * | 3/2003 | Terada et al. ................ 324/754 |
| 2003/0184330 | A1 | * | 10/2003 | Arisaka et al. .............. 324/754 |
| 2004/0169521 | A1 | * | 9/2004 | Rincon et al. ............... 324/754 |

FOREIGN PATENT DOCUMENTS

| | | |
|---|---|---|
| JP | 7-7052 | 1/1995 |
| JP | 2001-255340 | 9/2001 |
| JP | 2002-168904 | 6/2002 |

* cited by examiner

*Primary Examiner*—Ha Tran Nguyen
*Assistant Examiner*—Emily Y Chan
(74) *Attorney, Agent, or Firm*—Kratz, Quintos & Hanson, LLP.

(57) ABSTRACT

In an electrical characteristic measuring probe of the present invention constructed by assembling a plurality of probe parts, each comprising a base portion, a plurality of terminal portions extended outward from one end of the base portion, wiring patterns extended from a plurality of terminal portions onto the base portion respectively, and contact portions connected to the wiring patterns respectively, a plurality of thin plate-like probe parts are aligned such that respective thin-plate surfaces are placed in parallel with each other and the contact portions are directed in the same direction, and a plurality of probe parts and spacers are fixed by fixing means in a state that the spacer is arranged between a plurality of probe parts respectively.

13 Claims, 14 Drawing Sheets

ELECTRICAL CHARACTERISTIC MEASURING PROBE AND METHOD OF MANUFACTURING THE SAME

BACKGROUND OF THE INVENTION

1. Field of the Invention

The present invention relates to an electrical characteristic measuring probe and a method of manufacturing the same and, more particularly, an electrical characteristic measuring probe used in measuring the electrical characteristics of a test object such as an LSI chip, or the like and a method of manufacturing the same.

2. Description of the Related Art

In the step of measuring electrical characteristics of the LSI, the electrical characteristic measuring probe is brought into contact with a plurality of electrode pads of the LSI chip to get electrical conduction between them.

As such electrical characteristic measuring probe, in Patent Literature 1 (Patent Application Publication 2001-255340), the inspection probe having the coil spring that makes it possible to set a total length of a contact probe short is set forth. Also, in Patent Literature 2 (Patent Application Publication Hei 7-7052), the electrical characteristic measuring probe having the configuration in which cantilever structural members are formed locally by processing the silicon substrate three-dimensionally, then a conducting metal film is formed thereon, and then the cantilever structural members are held by the insulating substrate having the wiring patterns thereon is set forth.

In addition, in Patent Literature 3 (Patent Application Publication 2002-168904), the contactor in which the probe supporting beams are arranged in zigzag on the substrate so as to fit in with a size reduction of the electrode pads of the LSI chip is set forth.

In recent years, a size reduction of the electrode pads of the LSI chip is being advanced with the higher performance of the semiconductor integrated circuit. For example, in the electrode pads arranged in the peripheral type, a pitch between the pads is reduced to 100 μm or less. Therefore, the electrical characteristic measuring probe that can be adapted for use with the electrode pads of the LSI chip in reduced size is desired earnestly.

The probes set forth in Patent Literatures 2 and 3 are considered to fit in with the size reduction of the electrode pads of the LSI chip, nevertheless the fine cantilever structures must be formed locally by processing the silicon substrate three-dimensionally. As a result, manufacturing steps becomes complicated and also it is possible to bring about an increase in production cost.

Also, as the electrode pads of the LSI chip, there is the full-matrix type in which the pads are arranged on the overall main surface of the LSI chip in addition to the peripheral type in which the pads are arranged in the periphery of the LSI chip. The probe set forth in Patent Literature 1 can be adapted for use with the full-matrix type electrode pads, but it is extremely difficult to adapt such probe for use with the electrode pads whose pitch is reduced to about 150 μm or less. Also, in Patent Literatures 2 and 3, the planar probe is constructed by processing the silicon substrate. Therefore, it is not easy to adapt such planar probe for use with the full-matrix type electrode pads formed at a very narrow pitch.

SUMMARY OF THE INVENTION

It is an object of the present invention to provide an electrical characteristic measuring probe capable of being manufactured easily with a simple structure and capable of being adapted for use with electrode pads (peripheral type, full-matrix type) arranged at a narrow pitch, and a method of manufacturing the same.

The present invention is concerned with an electrical characteristic measuring probe which comprises a ring-like base portion to a center portion of which an opening portion is provided and which is composed of a semiconductor thin plate and an insulating film for coating the semiconductor thin plate; a plurality of terminal portions made of same material as the base portion and extended from the base portion to an inside of the opening portion like teeth of a comb; wiring patterns formed on the terminal portions and the base portion and extended from the plurality of terminal portions to the base portion respectively; metal bumps provide onto top end portions of the wiring patterns on the terminal portions; and a supporting member for supporting the base portion.

In the electrical characteristic measuring probe in the first invention, first the opening portion to pass through the predetermined portion of the thin plate-like semiconductor wafer is formed, and then the base portion used to constitute the probe and the terminal portions connected to the base portion and extended to the inside of the opening portion like the teeth of a comb are defined. Then, the insulating film for coating the semiconductor wafer is formed, and then the wiring patterns extending from the terminal portions to the base portion are formed on the upper surface of the semiconductor wafer. Then, the metal bumps (e.g., stud bumps) are formed on the top end portions of the wiring patterns on the terminal portions. Then, individual probe members are obtained by dividing the semiconductor wafer, and then the supporting member is provided to the base portion.

In this manner, in the present invention, unlike the related art, it is not needed to form locally the projections by processing the semiconductor wafer in a complicated manner three-dimensionally, and the metal bumps are formed on the wiring patterns on the flat terminal portions defined on the semiconductor wafer by a simple method. Therefore, the structure is made simple, and the manufacturing steps can be facilitated and also a reduction in production cost can be achieved.

Also, a plurality of terminal portions can be obtained by processing the semiconductor wafer that is suited for the fine pattern. Therefore, the probe can be adapted easily for use with the peripheral type electrode pads arranged at a reduced pitch as the test object.

Also, the present invention is concerned with an electrical characteristic measuring probe constructed by assembling a plurality of probe parts, each comprising a base portion composed of a semiconductor thin plate and an insulating film for coating the semiconductor thin plate, a plurality of terminal portions made of same material as the base portion and extended outward from one end of the base portion, wiring patterns formed on the terminal portions and the base portion and extended from the plurality of terminal portions to the base portion respectively, and contact portions formed on top end portions of the terminal portions and connected to the wiring patterns respectively, wherein the plurality of thin plate-like probe parts are aligned such that respective thin-plate surfaces are placed in parallel with each other and the contact portions are directed in a same direction, and the plurality of probe parts and spacers are fixed by fixing means in a state that the spacer is arranged between the plurality of probe parts respectively.

In the electrical characteristic measuring probe in the second invention, first a plurality of probe parts each having the base portion and a plurality of terminal portions extended outward from one end of the base portion are prepared. A plurality of wiring patterns extended from a plurality of terminal portions to the base portion respectively are formed on the probe parts, and then the contact portion connected to the wiring pattern is formed on the top end portions of the terminal portions respectively.

Then, a plurality of probe parts are aligned such that their thin-plate surfaces are placed in parallel with each other and the contact portions are directed in the same direction, and then the probe parts are fixed in a state that the spacer is arranged between a plurality of probe parts respectively.

When employing such configuration, the pitch between the probe parts in the direction parallel with the thin-plate surface is specified by a line and a space between a plurality of terminal portions of each probe parts. Meanwhile, the pitch between the probe parts in the direction perpendicular to the thin-plate surface is specified by a thickness of the terminal portion of each probe parts (which is equivalent to a thickness of the thinned semiconductor wafer) and a thickness of the spacer. As a result, the probe parts can be adapted easily for use with the full-matrix type electrode pads as the test object.

In addition, a plurality of terminal portions of the probe parts can be formed with high precision by processing the semiconductor wafer that is suited for the fine pattern, and also the thickness of the spacer can be adjusted with good precision. Therefore, the pitch of the terminal portions aligned in the full-matrix type can be narrowed with good precision. As a result, the probe can be adapted easily for use with the full-matrix type electrode pads arranged at a very narrow pitch (e.g., 150 µm or less).

In the preferred embodiment of the present invention, the terminal portions have flexuous portions between the base portion and the contact portions respectively. Therefore, when the terminal portions are elastically deformed, the contact portions are pushed against the electrode pads as the test object by a predetermined contact force respectively, so that the good electrical conduction can be established between them.

As described above, the electrical characteristic measuring probe in the first invention can be adapted for use with the peripheral type electrode pads in reduced size as the test object, and can be manufactured with a simple structure at low cost. The electrical characteristic measuring probe in the second invention can be adapted easily for use with the full-matrix type electrode pads in reduced size as the test object.

DETAILED DESCRIPTION OF THE PREFERRED EMBODIMENTS

Embodiments of the present invention will be explained with reference to the drawings hereinafter.

First Embodiment

Figure 1A:
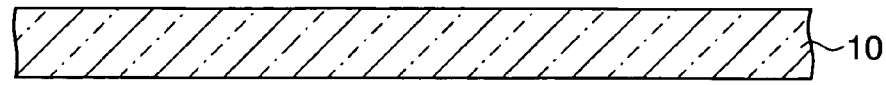
FIGS. 1A to 1H are views showing a method of manufacturing an electrical characteristic measuring probe in a first embodiment of the present invention.
Figure 1B:
Figure 1C:
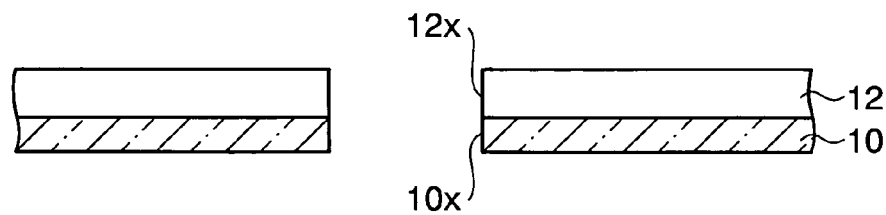
Figure 1D:
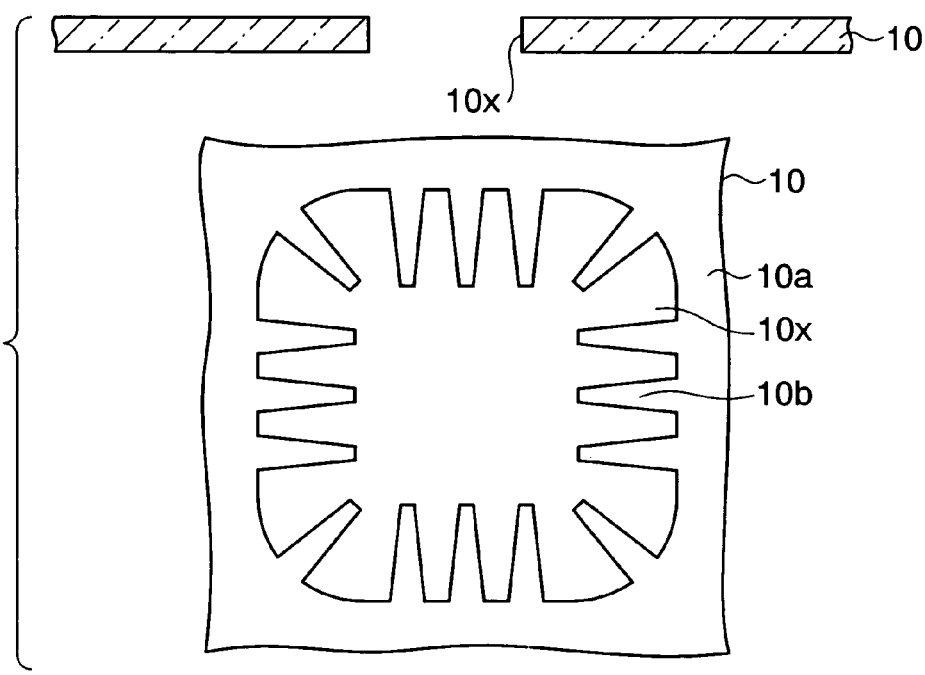
Figure 1E:
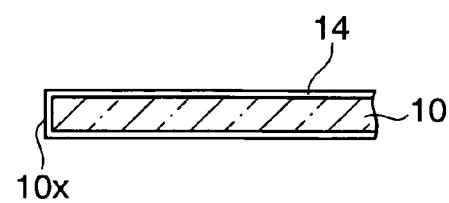
Figure 1F:
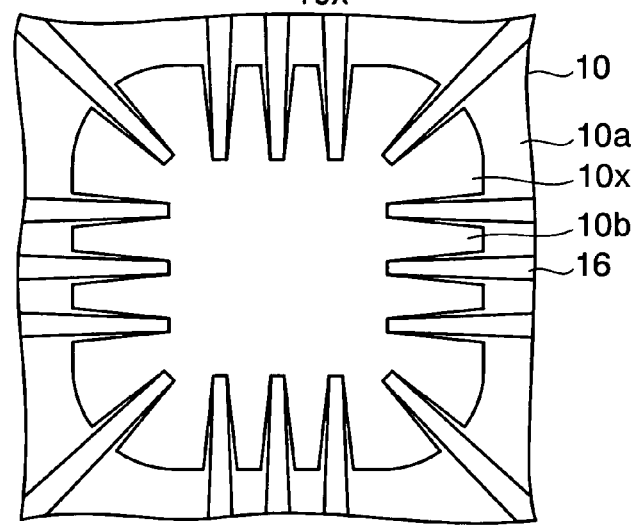
Figure 1G:
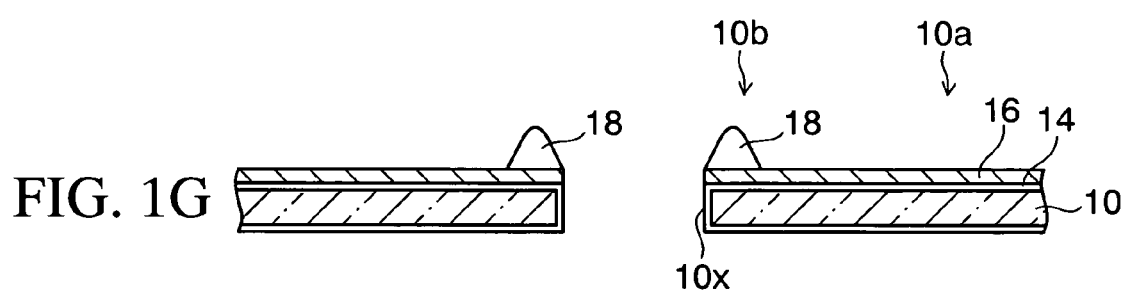
Figure 1H:
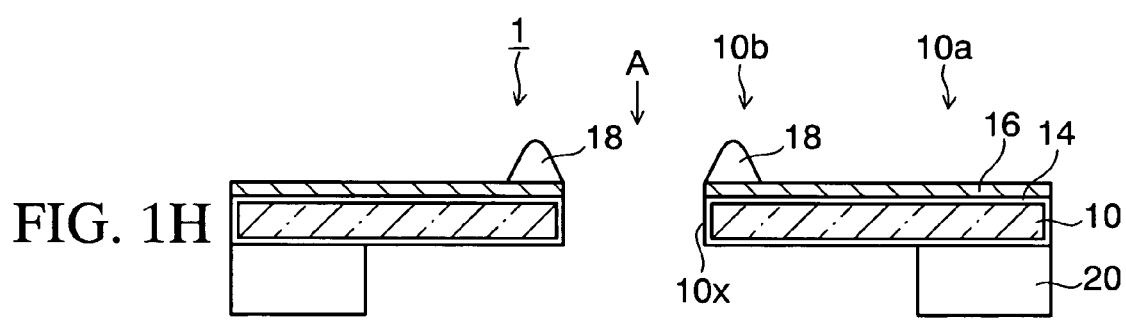
Figure 2:
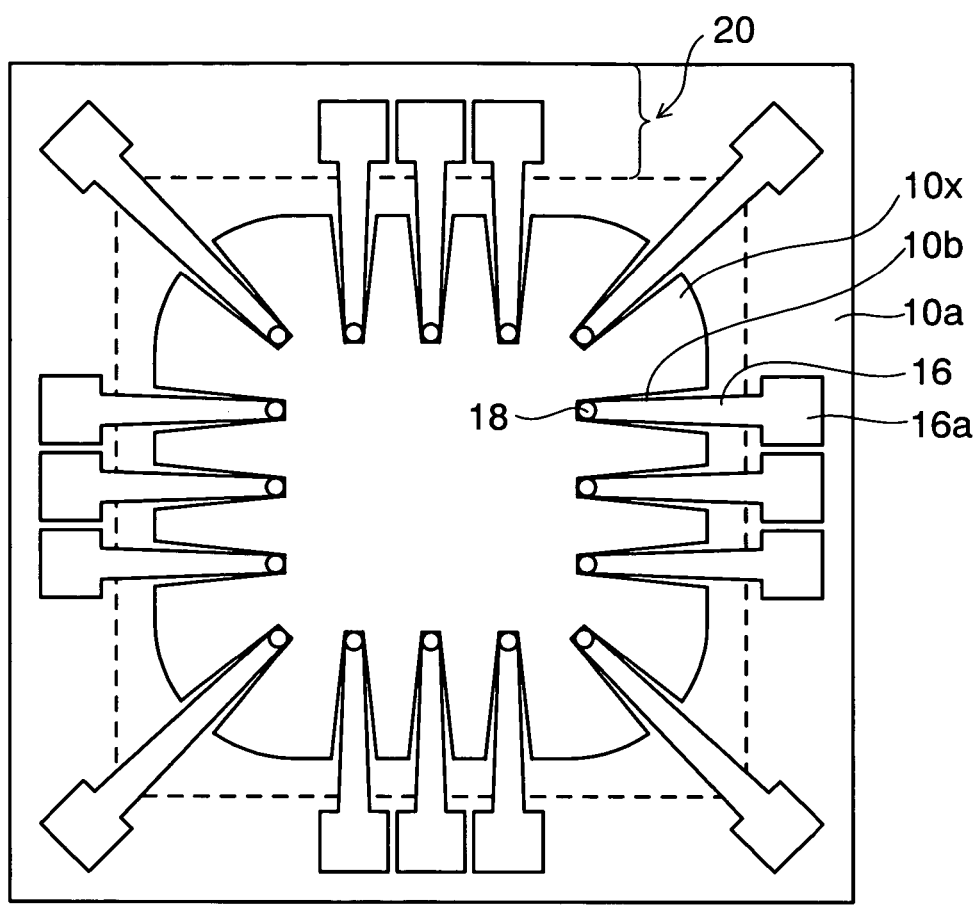
FIG. 2 is a plan view when a structure in FIG. 1H is viewed from the A direction.
Figure 3:
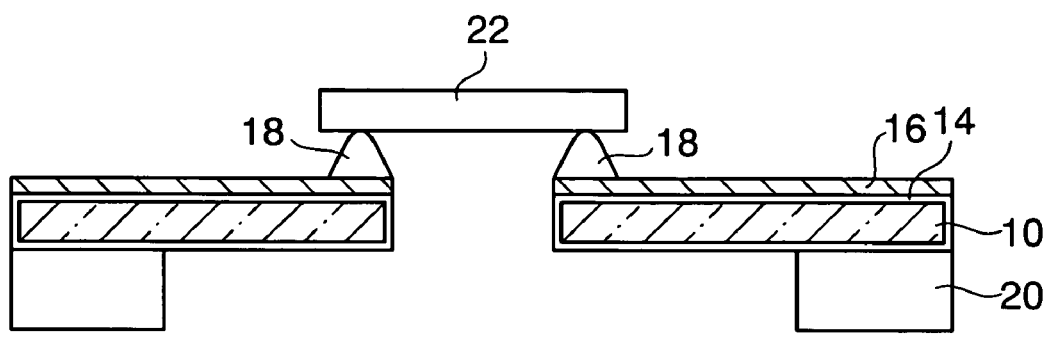
FIG. 3 is a sectional view showing a situation in which bumps of the electrical characteristic measuring probe in the first embodiment of the present invention are arranged on electrode pads of an LSI chip.

FIGS. 1A to 1H are views showing a method of manufacturing an electrical characteristic measuring probe in a first embodiment of the present invention, FIG. 2 is a plan view when a structure in FIG. 1H is viewed from the A direction, and FIG. 3 is a sectional view showing similarly a situation in which bumps of the electrical characteristic measuring probe in the first embodiment of the present invention are arranged on electrode pads of an LSI chip.

In the method of manufacturing the electrical characteristic measuring probe in the first embodiment of the present invention, as shown in FIG. 1A, first a semiconductor wafer 10 whose thickness is 600 to 800 µm is prepared. As the semiconductor wafer 10, a silicon wafer that is suited for fine patterns, or the like is used. Then, as shown in FIG. 1B, the thickness is reduced to 50 to 400 µm by grinding one surface of the semiconductor wafer 10.

Then, as shown in FIG. 1C, a dry film resist 12 in which an opening portion 12x used to form terminal portions of a probe is provided is formed on the semiconductor wafer 10. Then, an area of the semiconductor wafer 10, exposed from the opening portion 12x, is etched by the dry etching (RIE, or the like) using the dry film resist 12 as a mask to pass through the wafer. Thus, an opening portion 10x is formed. Then, the dry film resist 12 is removed. In this case, the liquid resist in which the similar opening portion is provided may be used in place of the dry film resist 12.

As a result, as shown in a lower view (plan view) in FIG. 1D, a base portion 10a in which the ring-like opening portion 10x is provided and a plurality of terminal portions 10b extended inward from the base portion like the teeth of a comb are defined. The base portion 10a and the terminal portions 10b constitute one probe and are defined in a plurality of areas of the semiconductor wafer 10.

In this case, prior to the formation of the dry film resist 12, an auxiliary mask such as a metal film, an insulating film, or the like may be formed on the semiconductor wafer 10, then an auxiliary mask layer may be etched by using the dry film resist 12 as a mask, and then the semiconductor wafer 10 may be etched by using the dry film resist 12 and the auxiliary mask layer as a mask. In this event, since the auxiliary mask layer acts as a hard mask, an improvement of etching precision can be attained rather than the case where the dry film resist 12 is used as a single layer, and therefore the terminal portions 10b placed at a narrower pitch can be formed with high precision. The auxiliary mask layer is removed selectively from the semiconductor wafer 10 after the dry film resist 12 is removed.

Then, as shown in FIG. 1E, an insulating film 14 such as a silicon oxide film, or the like is formed on one surface and the other surface of the semiconductor wafer 10 and a side surface of the opening portion 10x by the thermal oxidation method or the CVD method. Here, an organic insulating film may be employed as the insulating film 14. In this case, the insulating film 14 is obtained by forming a liquid solder resist on both surfaces of the semiconductor wafer 10 by means of the spray coating or the spin coating. Alternately, a polyimide resin, or the like may be formed by the electrodeposition method.

Then, as shown in FIG. 1F, wiring patterns 16 that extend from a top end portion of the terminal portion 10b to the base portion 10a side are formed on an upper surface of the semiconductor wafer 10. As the material of the wiring patterns 16, copper (Cu), aluminum (Al), Al alloy (AlSi, or the like), or the like may be used. The wiring patterns 16 are formed to have a connection pad (not shown) on the base portion 10a of the semiconductor wafer 10, as described later.

As the method of forming the wiring patterns 16, various methods may be applied. As one preferred example, the semi-additive process may be employed. More particularly, a seed layer is formed on the semiconductor wafer 10 by the sputtering method or the electroless plating, then a resist film having opening portions corresponding to the wiring patterns 16 is formed, and then metal film patterns are formed in the opening portions by the electroplating. Then, the resist film is removed, and then the seed layer is etched by using the metal film patterns as a mask. Otherwise, a metal film may be formed on the overall surface by the sputtering method, and then the wiring patterns 16 may be formed by patterning the metal film by means of the photolithography and the etching.

Then, as shown in FIG. 1G, metal bumps 18 are formed on top end portions of the wiring patterns 16 on the terminal portion 10b of the semiconductor wafer 10 by the wire bumping method. More particularly, first a metal wire such as a gold wire, or the like is projected from the capillary of the wire bonder by a predetermined length, then a top end portion of the metal wire is rounded like a sphere by the electric discharge, then the spherical top end portion of the metal wire is brought into contact with the top end portions of the wiring patterns 16 by dropping the capillary, and then the spherical top end portion is jointed to the wiring patterns 16 by the heating and the ultrasonic vibration. Then, the metal wire is fixed by the damper while pulling up the capillary and thus the metal wire is torn off. As a result, the stud-type metal bump 18 connected electrically to the wiring pattern 16 and made of Au is formed.

Alternately, a resist film having opening portions in the top end portions of the wiring patterns 16 is formed, then a metal film made of gold (Au), nickel (Ni), or the like is formed in the opening portions by the electroless plating, and then the resist film is removed, and thus the metal bump 18 may be obtained.

In this manner, in the present embodiment, the metal bump 18 serving as the contact portion of the probe can be formed by a simple method.

Then, as shown in FIG. 1H, an individual probe member consisting of the terminal portion 10b and the base portion 10a can be obtained by dividing the semiconductor wafer 10. In this case, the metal bump 18 may be formed on the top end portion of the wiring pattern 16 after the individual probe member is obtained.

Then, a ring-like supporting member 20 is fixed onto a peripheral portion of the other surface (opposite surface to the surface on which the wiring patterns 16 are formed) of the base portion 10a of the probe member. A resin substrate (printed substrate) is used as an example of the supporting member 20, and the supporting member 20 is secured to the base portion 10a by the adhesive or the screw clamp. When the screw clamp is employed, through holes for the screw clamp are provided to predetermined portions of the base portion 10a and the supporting member 20.

With the above, an electrical characteristic measuring probe 1 in the first embodiment is obtained.

As shown in a plan view of FIG. 2 when a structure in FIG. 1H is viewed from the A direction, the electrical characteristic measuring probe 1 in the present embodiment is constructed basically by the base portion 10a in which the opening portion 10x is provided in the center portion and consisting of the semiconductor thin plate (silicon thin plate) 10 and the insulating film 14 for coating the semiconductor thin plate, and a plurality of terminal portions 10b connected to the base portion 10a to extend inward like the teeth of a comb. Also, the wiring patterns 16 extending from the terminal portion 10b to the base portion 10a are formed on one surfaces of a plurality of terminal portions 10b and the base portion 10a respectively. The wiring patterns 16 have a connection pad 16a on the base portion 10a respectively.

In addition, the metal bump 18 is provided onto the top end portions of the wiring patterns 16 on the terminal portions 10b respectively. Further, the ring-like supporting member 20 is fixed to the peripheral portion of the other surface of the base portion 10a (opposite surface to the surface on which the wiring patterns 16 are formed).

The electrical characteristic measuring probe 1 in the present embodiment is constructed to be adapted for use with the peripheral type electrode pads (pitch is 100 μm or less) as the test object that is subjected to the size reduction. In other words, as shown in FIG. 3, the metal bumps 18 each formed on the top end portion of the terminal portion 10b of the electrical characteristic measuring probe 1 are aligned over the electrode pads of the peripheral type arranged on a LSI chip 22 as the test object. At this time, since the terminal portions 10b are formed to have the cantilever structure, the metal bumps 18 are pushed against the electrode pads of the LSI chip 22 by a predetermined contact force when the terminal portions 10b are elastically deformed, so that the terminal portions 10b are brought into their electrical conduction state.

Also, terminals (not shown) of an inspecting apparatus are connected electrically to the connection pads 16a of the wiring patterns 16 in the electrical characteristic measuring probe 1. Then, when various testing signals are supplied sequentially to the LSI chip 22 from the inspecting apparatus via the electrical characteristic measuring probe 1, the electrical characteristics of the LSI chip 22 are measured. In this case, the electrical characteristic measuring probe 1 of the present embodiment can measure the electrical characteristics of various test objects such as the semiconductor wafer on which predetermined elements are formed, CSP (Chip Size Package), or the like, in addition to the LSI chip 22.

As described above, in the method of manufacturing the electrical characteristic measuring probe 1 of the present embodiment, first the opening portion 10x is formed by the dry etching to pass through the predetermined portion of the thinned semiconductor wafer 10. Thus, the base portion 10a and the terminal portions 10b connected to the base portion 10a and extended the inner side of the opening portion 10x like the teeth of the comb are defined.

Then, the insulating film 14 for coating the semiconductor wafer 10 is formed, then the wiring patterns 16 extended to the base portion 10a from the terminal portions 10b are formed on the upper surface of the semiconductor wafer 10, and then the metal bumps 18 are formed on the top end portions of the wiring patterns 16 on the terminal portions 10b. Then, the semiconductor wafer 10 is divided to get individual probe members, and then the supporting member 20 is secured onto the other surface (opposite surface to the surface on which the wiring patterns 16 are formed) of the base portion 10a.

In this fashion, in the present embodiment, unlike the related art, it is not needed to form locally the projections by processing complicatedly the semiconductor wafer three-dimensionally, and the metal bumps 18 are formed on the wiring patterns 16 on the flat terminal portions 10b defined on the semiconductor wafer 10 by a simple method. Therefore, the manufacturing steps can be facilitated and also a reduction in production cost can be achieved.

Also, the terminal portions 10b of the probe are defined by processing the semiconductor wafer 10, which is suitable for the fine patterns, by means of the anisotropic dry etching. Therefore, the terminal portions 10b arranged in a predetermined narrow pitch (100 μm or less) can be formed with good positional precision.

Second Embodiment

Figure 4A:
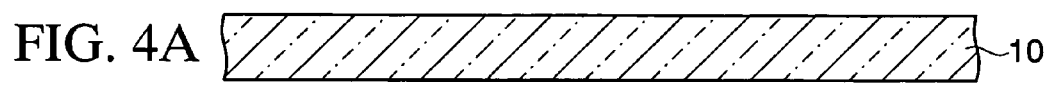
FIGS. 4A to 4H are views showing a method of manufacturing an electrical characteristic measuring probe in a second embodiment of the present invention.
Figure 4B:
Figure 4C:
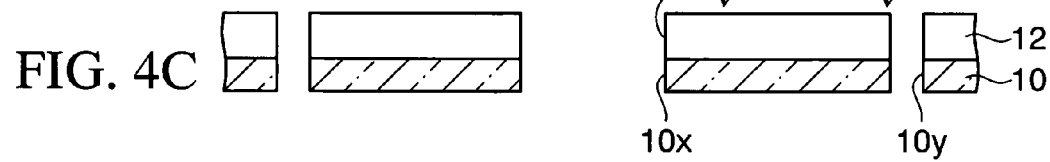
Figure 4D:
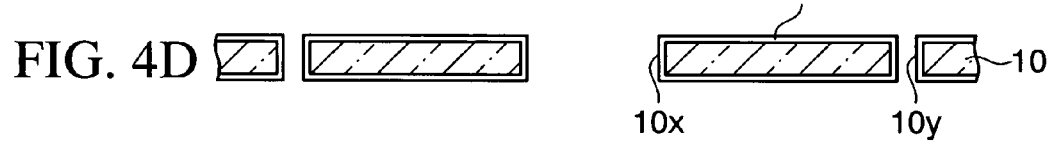
Figure 4E:
Figure 4E:
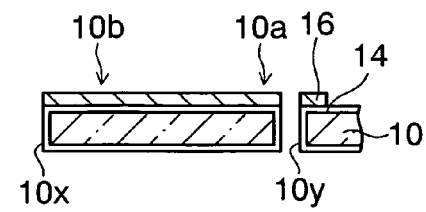
Figure 4F:
Figure 4F:
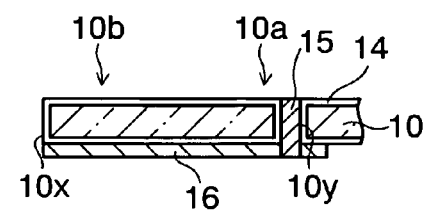
Figure 4G:
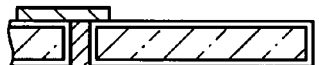
Figure 4G:
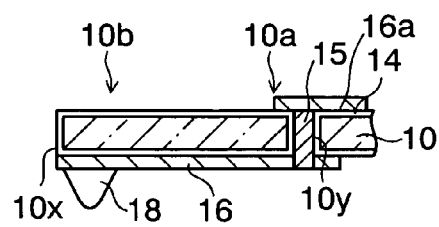
Figure 4H:
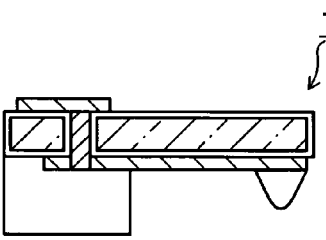
Figure 4H:
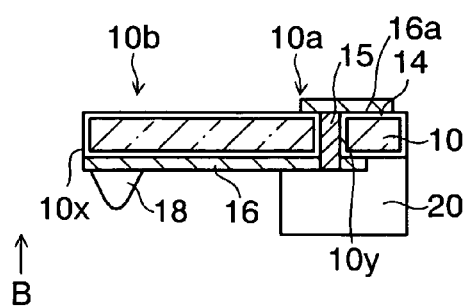
Figure 5:
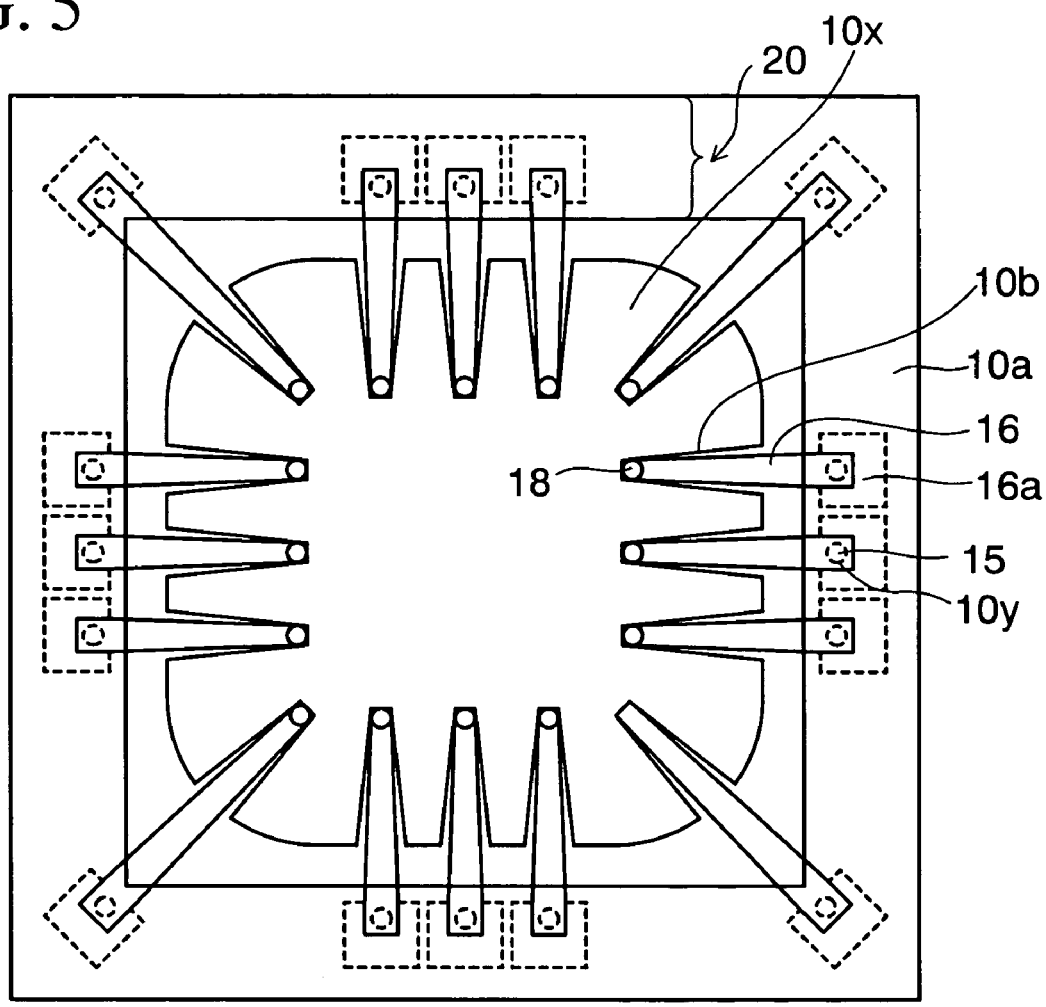
FIG. 5 is a plan view when a structure in FIG. 4H is viewed from the B direction.
Figure 6:
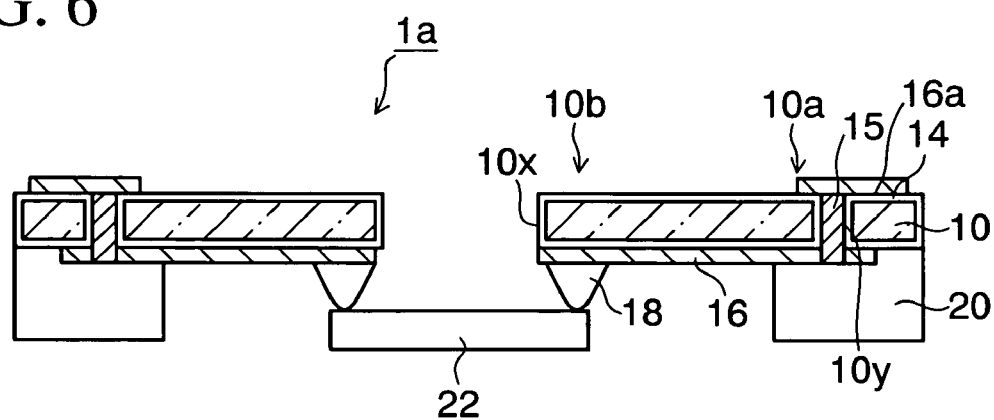
FIG. 6 is a sectional view showing a situation in which bumps of the electrical characteristic measuring probe in the second embodiment of the present invention are arranged on the electrode pads of the LSI chip.

FIGS. 4A to 4H are views showing a method of manufacturing an electrical characteristic measuring probe in a second embodiment of the present invention, FIG. 5 is a plan view when a structure in FIG. 4H is viewed from the B direction, and FIG. 6 is a sectional view showing similarly a situation in which bumps of the electrical characteristic measuring probe in the second embodiment of the present invention are arranged on the electrode pads of the LSI chip.

A different point of the second embodiment from the first embodiment is that the connection pads of the wiring patterns are arranged on the opposite surface to the surface on which the wiring patterns of the supporting members are formed. The detailed explanation about the same steps as those in the first embodiment will be omitted herein.

As shown in FIGS. 4A and 4B, like the first embodiment, first the semiconductor wafer 10 such as the silicon wafer, or the like is prepared, and then a thickness of the semiconductor wafer 10 is reduced by grinding one surface of the semiconductor wafer 10.

Then, as shown in FIG. 4C, the dry film resist 12 in which the opening portion 12x is provided in a predetermined portion is formed on the semiconductor wafer 10. Then, like the first embodiment, the opening portion 10x that passes through the semiconductor wafer 10 is formed by applying the dry etching to the semiconductor wafer 10 while using the dry film resist 12 as a mask. Then, the dry film resist 12 is removed.

At this time, the base portion 10a and the terminal portions 10b of the measuring probe are defined in the same way as the first embodiment, and then a through hole 10y is formed further in both end portions of the base portion 10a respectively in the second embodiment. In the second embodiment, as described later, the connection pads of the wiring patterns are formed on the opposite surface to the surface on which the wiring patterns of the semiconductor wafer 10 are formed. Therefore, the wiring patterns and the connection pads are connected electrically via the through holes 10y.

Then, as shown in FIG. 4D, like the first embodiment, the insulating film 14 is formed on one surface and the other surface of the semiconductor wafer 10 and side surfaces of the opening portion 10a and the through holes 10y. Then, as shown in FIG. 4E, the wiring patterns 16 extended from the terminal portions 10b to the base portion 10a side are formed on the upper surface of the semiconductor wafer 10 by the same method as the first embodiment. At this time, the wiring patterns 16 are formed in areas containing the through holes 10y and the wiring patterns 16 are arranged in vicinity of the through holes 10y.

Then, as shown in FIG. 4F, a through electrode 15 is formed in the through holes 10y respectively by burying a metal layer in the through holes by means of the electroplating that utilizes the wiring patterns 16 as a plating power-supply layer, in a state that a protection film (not shown) is pasted onto major portions of the wiring patterns 16. At this time, such plating is started from the portion of the wiring patterns 16 in vicinity of the bottom portion of the through holes 10y. Then, the film formation of the metal layer proceeds sequentially toward the upper side of the through holes 10y to bury the through holes 10y. Then, the protection film is removed.

Alternately, the through electrodes 15 may be formed by burying a conductive paste into the through holes 10y. In this case, FIG. 4F et seq. are illustrated in a state that FIG. 4A is turned upside down.

Then, as shown in FIG. 4G, the connection pads 16a connected to the through electrodes 15 are formed on the other surface (opposite surface to the surface on which the wiring patterns 16 are formed) of the semiconductor wafer 10. The connection pads 16a are formed in the similar method to the method of forming the wiring patterns 16, as explained in the first embodiment.

Thus, the wiring patterns 16 formed on one surface of the base portion 10a are connected electrically to the connection pads 16a formed on the other surface of the base portion 10a via the through electrodes 15 in the through holes 10y.

Then, like the first embodiment, the stud-type metal bumps 18 are formed on the top end portions of the wiring patterns 16 on the terminal portions 10b.

Then, as shown in FIG. 4H, individual probe members consisting of the terminal portions 10b and the base portion 10a are obtained by dividing the semiconductor wafer 10 into pieces. Then, the ring-like supporting member 20 is secured to the peripheral portion of one surface (the surface on which the wiring patterns 16 are formed) of the base portion 10a of the probe member. With the above, an electrical characteristic measuring probe 1a in the second embodiment can be obtained.

As shown in a plan view of FIG. 5 when FIG. 4H is viewed from the B direction, like the first embodiment, the electrical characteristic measuring probe 1a in the present embodiment is constructed basically by the ring-like base portion 10a in which the opening portion 10x is provided in the center portion and consisting of the semiconductor thin plate (silicon thin plate) 10 and the insulating film 14 for coating the semiconductor thin plate, and a plurality of terminal portions 10b connected to the base portion 10a to extend to the inside of the opening portion 10x like the teeth of a comb. Also, the wiring patterns 16 extending from the terminal portion 10b to the base portion 10a are formed on one surfaces of a plurality of terminal portions 10b and the base portion 10a respectively.

In the second embodiment, the wiring patterns 16 are connected to the connection pads 16a, which are formed on the other surface (opposite surface to the surface on which the wiring patterns 16 are formed) of the base portion 10a, via the through electrodes 15 provided in the base portion 10a. Also, the metal bumps 18 are provided to the top end portions of the wiring patterns 16 on the terminal portions 10b. In addition, the ring-like supporting member 20 is secured onto one surface (surface on which the wiring patterns 16 are formed) of the base portion 10a.

Then, as shown in FIG. 6, in the electrical characteristic measuring probe 1a of the second embodiment, the metal bumps 18 formed on the top end portions of the terminal portions 10b are arrange over the peripheral type electrode pads of the LSI chip 22. At this time, like the first embodiment, when the terminal portions 10b are elastically deformed, the metal bumps 18 are pushed against the electrode pads of the LSI chip 22 by a predetermined contact force, so that the terminal portions 10b are brought into their electrical conduction state.

In addition, the electrical characteristic measuring probe 1a in the second embodiment has such a structure that the connection pads 16a are arranged on the opposite surface to the surface of the base portion 10a on which the wiring patterns 16 are formed. Then, terminals (not shown) of the inspecting apparatus are connected electrically to the connection pads 16a. Then, when various testing signals are supplied sequentially to the LSI chip 22 from the inspecting apparatus via the electrical characteristic measuring probe 1a, the electrical characteristics of the LSI chip 22 are measured.

Thus, the electrical characteristic measuring probe 1a of the second embodiment can achieve the same effects as those in the first embodiment.

Third Embodiment

Figure 7A:
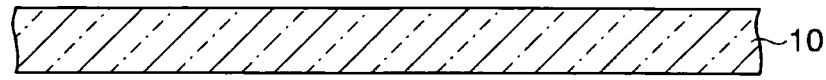
FIGS. 7A to 7G are views (#1) showing a method of manufacturing an electrical characteristic measuring probe in a third embodiment of the present invention.
Figure 7B:
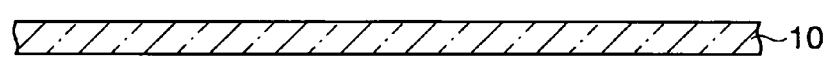
Figure 7C:
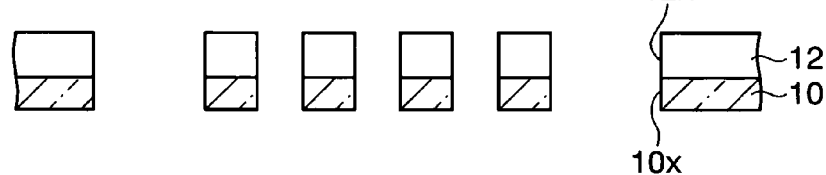
Figure 7D:
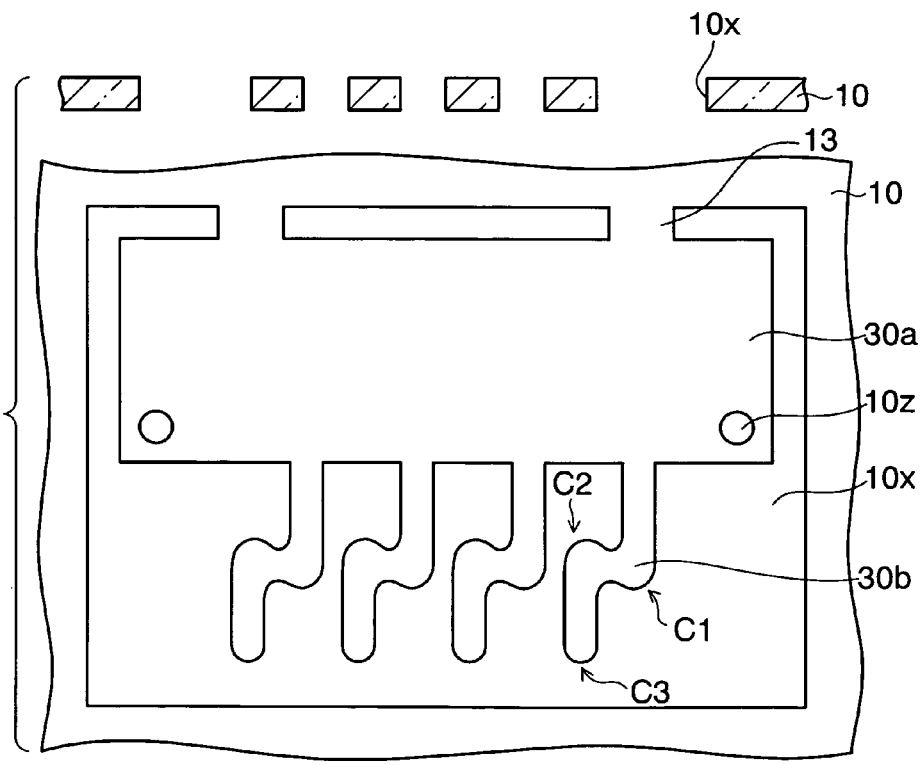
Figure 7E:
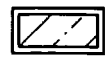
Figure 7E:
Figure 7E:
Figure 7E:
Figure 7E:
Figure 7E:
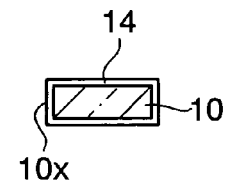
Figure 7F:
Figure 7F:
Figure 7F:
Figure 7F:
Figure 7F:
Figure 7F:
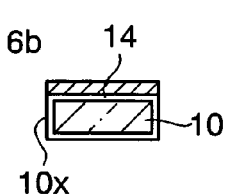
Figure 7G:
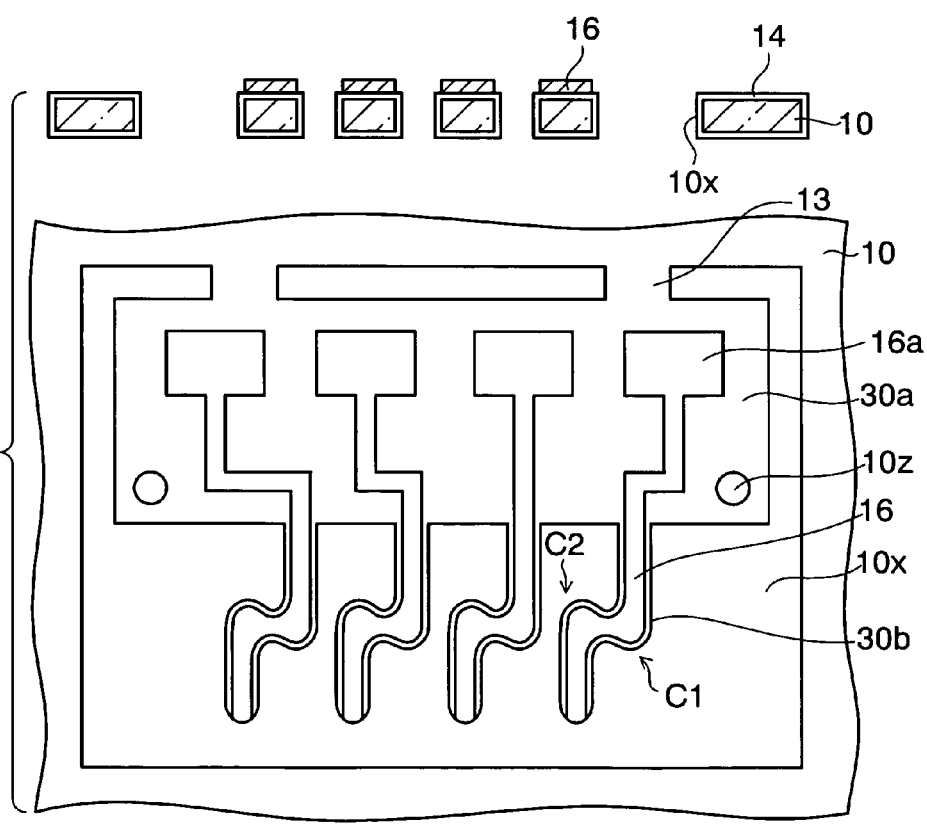
Figure 8:
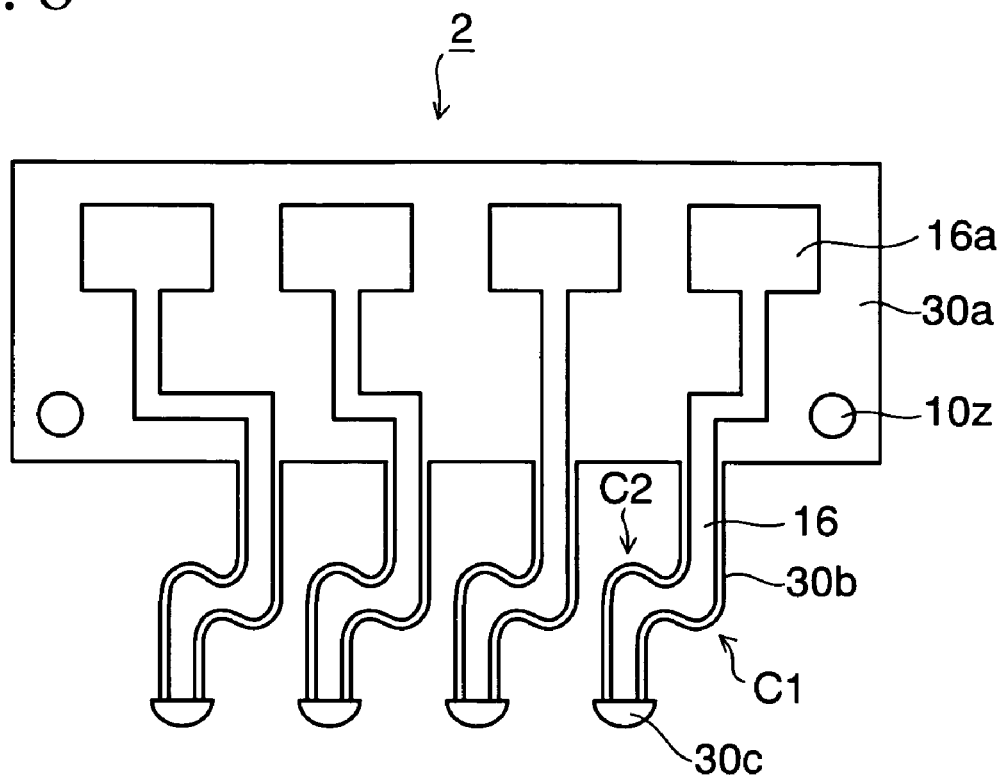
FIG. 8 is a view (#2) showing the method of manufacturing the electrical characteristic measuring probe in the third embodiment of the present invention.
Figure 9:
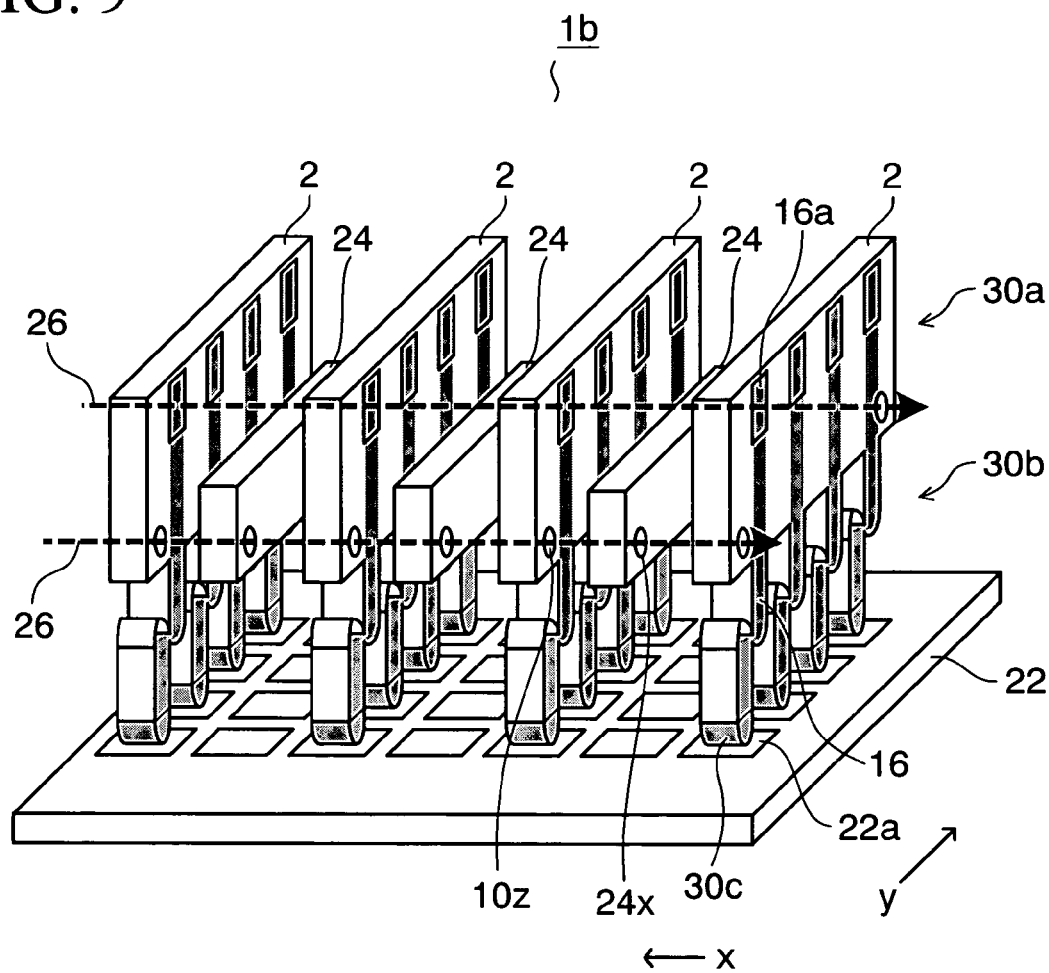
FIG. 9 is a configurative view showing the electrical characteristic measuring probe in the third embodiment of the present invention.
Figure 10:
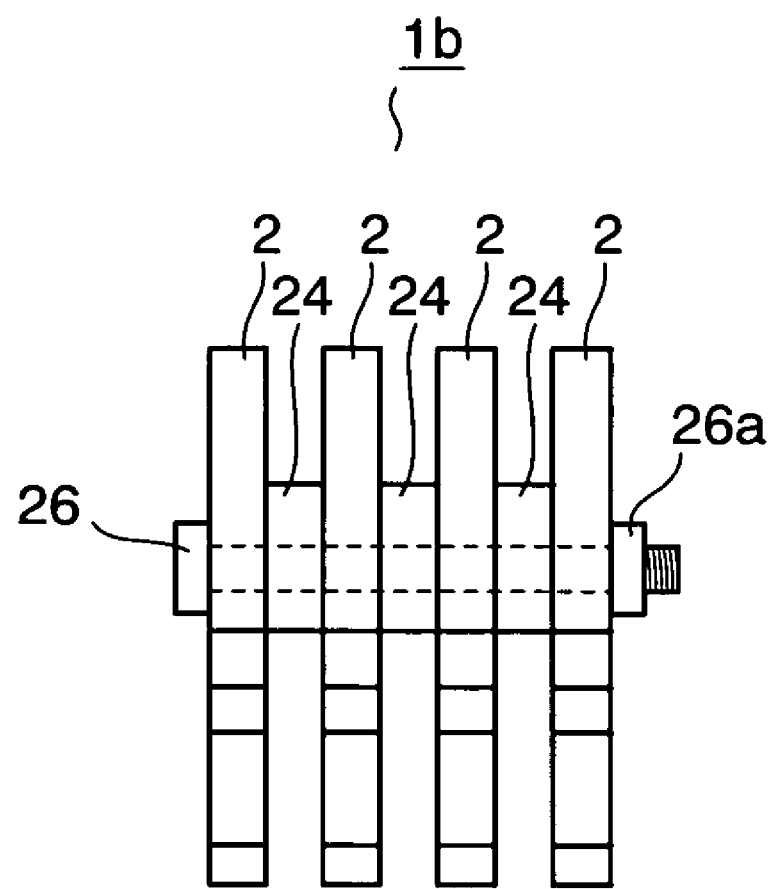
FIG. 10 is a side view showing the electrical characteristic measuring probe in the third embodiment of the present invention.

FIGS. 7A to 7G and FIG. 8 are views showing a method of manufacturing an electrical characteristic measuring probe in a third embodiment of the present invention, FIG. 9 is a configurative view showing similarly the electrical characteristic measuring probe, and FIG. 10 is a side view showing similarly the electrical characteristic measuring probe.

The electrical characteristic measuring probe in the third embodiment is constructed to be adapted for use with the full-matrix type electrode pads, which are subjected to the size reduction, as the test objected.

As shown in FIGS. 7A and 7B, like the first embodiment, first the semiconductor wafer 10 such as the silicon wafer, or the like is prepared. Then, the thickness of the semiconductor wafer 10 is reduced to 50 to 400 μm by grinding one surface of the semiconductor wafer 10.

Then, as shown in FIG. 7C, the dry film resist 12 in which the opening portion 12x is provided in the predetermined portion is formed on the semiconductor wafer 10. Then, like the first embodiment, the opening portion 10x that passes through the semiconductor wafer 10 is formed by etching the semiconductor wafer 10 while using the dry film resist 12 as a mask. Then, the dry film resist 12 is removed.

At this time, in the third embodiment, as shown in FIG. 7D, a base portion 30a and a plurality of terminal portions 30b extended from one end of the base portion 30a are defined. The terminal portions 30b are connected to the base portion 30a to have two flexuous portions C1, C2, and top end portions C3 act later as the contact portion that comes into contact with the electrode pads as the test object. At this time, through holes 10z are formed simultaneously in both end portions of the base portion 30a, Upon assembling the probe parts formed of the base portion 30a to which the terminal portions 30b are connected, a bolt (fixing pin) is inserted into the through holes 10z respectively, as described later. In this case, the base portion 30a is coupled to the semiconductor wafer 10 via connecting portions 13 at a point of this time.

Then, as shown in FIG. 7E, the insulating film 14 is formed on one surface and the other surface of the semiconductor wafer 10 and the side surface of the opening portion 10x in FIG. 7D by the thermal oxidation method or the CVD method.

Then, as shown in FIG. 7F, a metal film 16b is formed on the insulating film 14 on the upper surface of the semiconductor wafer 10 by the sputtering method, and then a dry film resist 17 in which opening portions 17x are provided in predetermined portions is formed on the metal film 16b. Then, as shown in FIG. 7G, the wiring patterns 16 are formed by etching the metal film 16b while using the dry film resist 17 as a mask.

At this time, as shown in a plan view on the lower side of FIG. 7G, the wiring patterns 16 are formed correspondingly on the terminal portions 30b having the flexuous portions C1, C2 respectively and also formed to extend from the terminal portions 30b to the base portion 30a, whereby the connection pads 16a are arranged on the base portion 30a, Also, a pitch between the wiring patterns 16 formed on the terminal portions 30b is converted on the base portion 30a, and a pitch between the connection pads 16a is arranged wider than the pitch between the wiring patterns 16 on the terminal portions 30b.

Then, as shown in FIG. 8, individual probe parts 2 each formed of the base portion 30a to which a plurality of terminal portions 30b are connected are obtained by cutting off the connecting portions 13 connected to the base portion 30a.

Then, the top end portions of the terminal portions 30b of the probe parts 2 are dipped selectively into the electroless plating solution. Thus, an Au layer is formed selectively on the top end portions of the terminal portions 30b as contact portions 30c. At this time, the contact portions 30c are formed in a state that such contact portions are connected electrically to the wiring patterns 16.

In this case, in place of the Au layer, a Ni layer may be formed by the electroless plating as the contact portions 30c. Alternately, a laminated layer of the Ni layer and the Au layer may be used as the contact portions 30c. Also, as described later, the contact portions 30c may be formed collectively after a plurality of probe parts 2 are assembled.

As a result, a plurality of probe parts 2 are used to manufacture the electrical characteristic measuring probe in the present embodiment are prepared.

Then, as shown in FIG. 9, a plurality of probe parts 2 are arranged such that their thin-plate surfaces are placed in parallel with each other and the contact portions 30c are directed in the same direction, and then a spacer 24 is arranged between the base portions 30a of a plurality of probe parts 2 respectively. A through hole 24x is provided in both end portions of the spacer 24 respectively, and the spacers 24 are arranged to align their through holes 24x with the through holes 10z in the base portions 30a of the probe parts 2.

Any material may be employed as the spacer 24 if at least a surface layer may be formed of the insulating material. It is preferable that the silicon oxide film formed on the silicon member, the glass parts, or the like may be employed.

Then, with reference to FIG. 9 together with FIG. 10, a nail-like bolt (fixing pin) 26 on one end side of which a thread is cut is inserted into the through holes 10a of the probe parts 2 and the through holes 24x of the spacers 24. In addition, the probe parts 2 and the spacers 24 are fixed by screwing a nut 26a on one end side of the fixing pin 26 that is protruded from the through hole 10z of the base portion 30a of the probe parts 2. The bolt 26 and the nut 26a are exemplified as the fixing means for fixing the probe parts 2 and the spacers 24 together. The fixing means is not limited to this, and various fixing means may be employed.

In this case, after the probe parts 2 and the spacers 24 are assembled together, the contact portions 30c may be formed selectively by dipping the top end portions of the terminal portions 30b into the electroless plating solution.

As a result, an electrical characteristic measuring probe 1b of the third embodiment is obtained.

As shown in FIG. 9 and FIG. 10, the electrical characteristic measuring probe 1b of the present embodiment has such a structure that the spacer 24 is arranged between a plurality of probe parts 2 respectively. The probe parts 2 and the spacers 24 are fixed by inserting the bolt 26 into the through holes 10z, 24x provided thereto and then screwing the nut 26a on the bolt 26.

The probe parts 2 consists of the thin plate-like base portion 30a and a plurality of terminal portions 30b connected to one end of the terminal portion 30b and extended therefrom. The flexuous portions C1, C2 (FIG. 8) are provided to the terminal portion 30b between the base portion 30a and the contact portion 30c. In addition, the wiring patterns 16 extended from the terminal portion 30b to the base portion 30a are formed on the terminal portion 30b and the base portion 30a, and the connection pads 16a connected to the wiring patterns 16 are arranged on the base portion 30a.

Further, the contact portions 30c are formed by applying the Au or Ni plating to the top end portions of the terminal portions 30b.

Then, as shown in FIG. 9, the contact portions 30c of the terminal portions 30b of the electrical characteristic measuring probe 1b are arranged on electrode pads 22a that are aligned in the full-matrix type LSI chip 22. At this time, since the terminal portions 30b have the flexuous portions C1, C2 (FIG. 8) between the base portion 30a and the contact portions 30c respectively, the contact portions 30c are pushed against the electrode pads 22a of the LSI chip 22 by the predetermined contact force when the terminal portions 30b are elastically deformed, whereby the terminal portions 30b are brought into their electrical conduction state.

In addition, terminals (not shown) of the inspecting apparatus are connected electrically to the connection pads 16a of the wiring patterns 16 in the electrical characteristic measuring probe 1b. Then, when various testing signals are supplied sequentially to the LSI chip 22 from the inspecting apparatus via the electrical characteristic measuring probe 1b, the electrical characteristics of the LSI chip 22 are measured. The electrical characteristic measuring probe 1b of the present embodiment can measure the electrical characteristics of various test objects such as the semiconductor wafer on which predetermined elements are formed, the CSP (Chip Size Package), or the like, in addition to the LSI chip 22.

In this case, the terminal portions 30b to which two flexuous portions C1, C2 are provided respectively are exemplified. Various structures may be employed if the structure is elastically deformed to apply the predetermined contact force. Also, the flexuous portions C1, C2 are not always provided to the terminal portion 30b, and the terminal portion 30b may be formed in a straight shape as the case may be.

Then, the pitch between the terminal portions 30b of the electrical characteristic measuring probe 1b is mentioned hereunder. The pitch between the terminal portions 30b in the direction parallel with the thin-plate surface of the probe parts 2 (the y direction in FIG. 9) is specified by a line and a space between a plurality of terminal portions 30b of each probe parts 2. Meanwhile, the pitch between the terminal portions 30b in the direction perpendicular to the thin-plate surface of the probe parts 2 (the x direction in FIG. 9) is specified by a thickness of the terminal portion 30b of each probe parts 2 (which is equivalent to a thickness of the thinned semiconductor wafer 10) and a thickness of the spacer 24.

As a result, it is important to set the pitch and the thickness of the terminal portion 30b of the probe parts 2 and the thickness of the spacer 24. These can be adjusted appropriately to correspond to the pitch of the full-matrix type electrode pads as the test object such as the LSI chip 22, or the like.

As described above, the electrical characteristic measuring probe 1b in the present embodiment has the structure in which a plurality of thin plate-like probe parts 2 are fixed in a state that their thin-plate surfaces are placed in parallel with each other, their contact portions 30c are aligned to direct in the same direction, and the spacers 24 are arranged between them. Therefore, the manufacturing probe 1b can be adapted for use with the full-matrix type electrode pads as the test object.

In addition, the terminal portions 30b of the probe parts 2 can be formed with high precision by applying the anisotropic dry etching to the semiconductor wafer 10 that is suited for the fine patterns, and also the thickness of the spacer 24 can be adjusted with good precision. Therefore, the pitch of the terminal portions 30b aligned in the full-matrix type can be narrowed with good precision. As a result, the measuring probe 1b can be adapted easily for use with the full-matrix type electrode pads arranged at a very narrow pitch (150 µm or less).

What is claimed is:

1. An electrical characteristic measuring probe comprising:
   a ring-like base portion to a center portion of which an opening portion is provided and which is formed of a silicon thin plate;
   a plurality of terminal portions in which the silicon thin plate is extended and formed from the base portion to an inside of the opening portion like teeth of a comb, each one of said terminal portions extending directly from the ring-like base portion to the inside of the opening portion, and formed in one body with the ring-like base portion;
   an insulating film covering an upper surface and a lower surface of the base portion and the terminal portions;

wiring patterns formed on the terminal portions and the base portion and extended from the plurality of terminal portions to the base portion respectively; and metal bumps provide onto top end portions of the wiring patterns on the terminal portions, each one of said terminal portions having only one of said wiring patterns.

2. An electrical characteristic measuring probe according to claim 1, wherein connection pads connected to the wiring patterns are formed on a surface of the base portion on which the wiring patterns are formed, and a supporting member is provided on an opposite surface to the surface of the base portion on which the wiring patterns are formed.

3. An electrical characteristic measuring probe according to claim 1, wherein the silicon thin plate is formed of a silicon plate having a thickness of 50 to 400 µm.

4. An electrical characteristic measuring probe comprising:

a ring-like base portion to a center portion of which an opening portion is provided and which is formed of a silicon thin plate;

a plurality of terminal portions in which the silicon thin plate is extended and formed from the base portion to an inside of the opening portion like teeth of a comb, each one of said terminal portions extending directly from the ring-like base portion to the inside of the opening portion, and formed in one body with the ring-like base portion;

an insulating film covering an upper surface and a lower surface of the base portion and the terminal portions;

wiring patterns formed on the terminal portions and the base portion and extended from the plurality of terminal portions to the base portion respectively; and metal bumps provide onto top end portions of the wiring patterns on the terminal portions, each one of said terminal portions having only one of said wiring patterns, wherein the base portion contains such a structure that through holes which pass through the base portion and side surfaces of which are covered with the insulating film are formed and also through electrodes connected to the wiring patterns are filled in the through holes, connection pads connected to the through electrodes are formed on a surface opposite to the surface of the base portion on which the wiring patterns are formed, and a supporting member is provided onto a surface of the base portion on which the wiring patterns are formed.

5. An electrical characteristic measuring probe according to claim 1, wherein the metal bumps are made of gold or nickel.

6. An electrical characteristic measuring probe according to claim 1, wherein a pitch between the plurality of terminal portions is 100 µm or less.

7. An electrical characteristic measuring probe constructed by assembling a plurality of probe parts, each comprising a base portion formed of a semiconductor thin plate, a plurality of terminal portions in which the semiconductor thin plate is extended and formed outward from one end of the base portion and formed in one body with the base portion, an insulating film covering the base portion and the terminal portions, wiring patterns formed on the terminal portions and the base portion and extended from the plurality of terminal portions to the base portion respectively, and contact portions formed on top end portions of the terminal portions and connected to the wiring patterns respectively, wherein the plurality of thin plate-like probe parts are aligned such that respective thin-plate surfaces are placed in parallel with each other and the contact portions are directed in a same direction, and the plurality of probe parts and spacers are fixed by fixing means in a state that the spacer is arranged between the plurality of probe parts respectively.

8. An electrical characteristic measuring probe according to claim 7, wherein flexuous portions are provided to the plurality of terminal portions between the base portion and the contact portions respectively.

9. An electrical characteristic measuring probe according to claim 7, wherein connection pads connected to the wiring patterns respectively are arranged on the base portion.

10. An electrical characteristic measuring probe according to claim 7, wherein the fixing means consists of a bolt and a nut, through holes are provided in both end portions of the base portion and the spacer respectively, the bolt is inserted into the through holes of the base portion and the spacer, and the bolt is screwed and fixed with the nut.

11. An electrical characteristic measuring probe according to claim 7, wherein the contact portions are made of gold or nickel.

12. An electrical characteristic measuring probe according to claim 7, wherein a pitch between the plurality of terminal portions in a direction parallel with a thin-plate surface of the base portion is specified by a line and a space between the plurality of terminal portions of the probe parts, and a pitch between the terminal portions aligned in a direction perpendicular to the thin-plate surface of the base portion is specified by a thickness of the terminal portion and a thickness of the spacer.

13. An electrical characteristic measuring probe according to claim 12, wherein both the pitch between the plurality of terminal portions in the direction parallel with the thin-plate surface of the base portion and the pitch between the terminal portions aligned in the direction perpendicular to the thin-plate surface of the base portion are set to 150 µm or less.

* * * * *